United States Patent [19]

Nakamura et al.

[11] Patent Number: 5,299,214
[45] Date of Patent: Mar. 29, 1994

[54] HEAT RADIATING COMPONENT AND SEMICONDUCTOR DEVICE PROVIDED WITH THE SAME

[75] Inventors: Tsutomu Nakamura; Takahisa Iguchi; Tetsuo Nakai, all of Hyogo, Japan

[73] Assignee: Sumitomo Electric Industries, Ltd., Osaka, Japan

[21] Appl. No.: 905,241

[22] Filed: Jun. 26, 1992

[30] Foreign Application Priority Data

Jul. 1, 1991 [JP] Japan ................... 3-160210
Mar. 19, 1992 [JP] Japan ................... 4-063473

[51] Int. Cl.$^5$ ............................... H01S 3/04
[52] U.S. Cl. ............................ 372/36; 372/34; 257/706; 257/712; 257/713
[58] Field of Search .............. 372/36, 34; 257/706, 257/712, 713

[56] References Cited

U.S. PATENT DOCUMENTS

5,008,737  4/1991  Burnham et al. ............... 372/36

FOREIGN PATENT DOCUMENTS

0286306  10/1988  European Pat. Off. .
62-196858  8/1987  Japan .

OTHER PUBLICATIONS

Diamond—Film Synthesis Using DC Plasma Jet CVD by K. Kurihara et al., Fujitsu Sci. Techn. J. 25, Mar. 1989 pp. 44-51.
Diamond Thin Film: Applications in Electronics Packaging by D. Hoover et al, Solid State Technology Feb. 1991 pp. 89-91.
Diamond and Diamondlike Films: Deposition Processes and Properties by D. V. Deshpandey et al., Molecular Crystals and Liquid Crystals, Letters Section Mar. 1990, pp. 2294-2302.

*Primary Examiner*—Georgia Y. Epps
*Attorney, Agent, or Firm*—W. G. Fasse; W. F. Fasse

[57] ABSTRACT

A semiconductor laser is provided with a heat radiating component for radiating or dissipating heat which is generated in operation. In this heat radiating component, a polycrystalline diamond layer (3) synthesized by vapor deposition is formed on an upper surface of a stem (4). A semiconductor laser element (1) is bonded, e.g. by brazing to the surface of the vapor-deposited polycrystalline diamond layer (3) through a brazing filler metal (2). The heat radiating component has a thermal expansion coefficient which is the same as that of an LSI chip to be mounted thereon to provide an excellent heat radiating property.

17 Claims, 2 Drawing Sheets

HEAT RADIATING COMPONENT AND SEMICONDUCTOR DEVICE PROVIDED WITH THE SAME

FIELD OF THE INVENTION

The present invention relates to a heat radiating component and a semiconductor device equipped with such a component for dissipating heat which is generated by a semiconductor element such as a semiconductor laser element or an LSI chip.

BACKGROUND INFORMATION

In general, heat radiating components for dissipating heat which is generated by a semiconductor element such as a semiconductor laser element or an LSI chip, are well known. For example, the range of application of a semiconductor laser is rapidly widening in the field of optical communication, optical memories and the like. As a result, efforts have been made to increase the output or reduce the wavelength of such a semiconductor laser. Under such circumstances, the heat generating value of a semiconductor laser element is apt to be increased, whereby the reliability of the semiconductor laser element is disadvantageously deteriorated and its life is reduced. To avoid these problems, there has been developed a semiconductor laser which is provided with a heat radiating component of a heat conductive material, in order to dissipate heat generated by the semiconductor laser element.

FIG. 1 is a block diagram showing a conventional semiconductor laser which is provided with a heat radiating component. Referring to FIG. 1, the conventional semiconductor laser comprises a stem 4, a submount 5 which is mounted on a prescribed upper surface region of the stem 4 through a brazing filler metal 6, and a semiconductor laser element 1 which is mounted on a prescribed upper surface region of the submount 5 through another brazing filler metal 2. The brazing filler metal 6 is adapted to bond the submount 5 to the stem 4, while the other brazing filler metal 2 is adapted to bond the semiconductor laser element 1 to submount 5. Table 1 shows materials and shapes of the semiconductor laser element 1, the submount 5, the brazing filler metals 2 and 6, and the stem 4 respectively.

TABLE 1

| Element 1 | Material: | Compound Semiconductor Composed of Ga, As, In, P, Al or the like |
|---|---|---|
| | Shape: | up to 0.5 mm square |
| Submount 5 | Material: | Si, AlN, BeO, Cu—W Alloy, Cu—Mo Alloy, SiC, cBN polycrystalline Substance or Single-Crystalline Diamond |
| | Shape: | up to 1 mm square, 0.2 to 0.5 mm thick |
| Brazing Filler Metals 2 & 6 | Element Side (2): | Au—Sn Alloy, Pb—Sn Alloy or In |
| | Stem Side (6): | Au—Si Alloy or Pb—Sn Alloy |
| Stem 4 | Material: | Cu, Cu—W Alloy, Cu—Mo Alloy or Cu—W—Mo Alloy |
| | Shape: | 5 to 15 mm square |

In operation, heat which is generated by the semiconductor laser element 1 is transmitted to the stem 4 through the submount 5 for dissipation. The submount 5 is adapted to efficiently transmit the heat generated from the semiconductor laser element 1 to the stem 4. Therefore, the submount 5 is made of a material having a high thermal conductivity, such as a Cu-W alloy, a polycrystalline substance of cBN (cubic boron nitride) or single-crystalline diamond shown in Table 1, for example.

In the conventional semiconductor laser, however, the brazing filler metal 6 is interposed between the submount 5 and the stem 4, to inevitably resist against the thermal conduction from the submount 5 to the stem 4. In the conventional semiconductor laser, therefore, it has been difficult to attain an efficient heat radiation or dissipation due to such interposition of the brazing filler metal 6.

When the submount 5 is made of high-priced single-crystalline diamond or the like, its size is considerably reduced as compared with the upper surface of the stem 4. Consequently, the thermal conduction surfaces of the submount 5 and the stem 4 are so reduced that thermal diffusion mainly progresses vertically along the direction of depth of the stem 4 and no sufficient thermal diffusion is attained in the transverse direction. Also when the submount 5 is made of single-crystalline diamond, it is difficult to attain a sufficient heat radiation efficiency.

On the other hand, the brazing filler metal 2 which is interposed between the submount 5 and the semiconductor laser element 1 is made of an Au-Sn alloy, a Pb-Sn alloy or the like. However, such a material has a high thermal expansion coefficient. When the temperature of the semiconductor laser element 1 is increased during operation, the semiconductor laser element 1 is extremely distorted by heat. Such heat distortion leads to an abnormal operation of the semiconductor laser element 1 or to a reduction of its operational life.

In general, therefore, it has been difficult to provide a heat radiating component which has an excellent radiation effect and a semiconductor laser which has excellent operation characteristics. Further, it has been difficult to effectively prevent the heat distortion of a semiconductor element such as a semiconductor laser element or an LSI chip, which is bonded by a brazing filler metal having a high thermal expansion coefficient.

SUMMARY OF THE INVENTION

It is an object of the present invention to improve the heat radiating property of a heat radiating component.

Another object of the present invention is to improve the heat radiating property of a heat radiating component while preventing heat distortion of a semiconductor element mounted on the component.

Still another object of the present invention is to improve the operating characteristics of a semiconductor device by an excellent heat radiating effect.

A further object of the present invention is to prevent operational failures in an LSI package and increase its operational life.

According to a first aspect of the present invention, a heat radiating component comprises a stem which has a mounting surface for receiving a semiconductor element thereon and a vapor-deposited polycrystalline diamond layer covering the mounting surface of the stem.

In operation, the mounting surface of the stem is entirely covered with the polycrystalline diamond layer which is formed by vapor deposition. Thus, no brazing layer is required between the vapor-deposited polycrystalline diamond layer and the stem, whereby the efficiency of the thermal conduction from the former to the latter is improved. Further, the vapor-deposited polycrystalline diamond layer having a high thermal conductivity is adapted to cover the overall mounting surface of the stem or a part thereof with a wider area as compared with the contour of the semiconductor element, whereby thermal conduction surfaces are so widened that heat generated by the semiconductor element is diffused along the direction of depth of the stem as well as along the plane of the mounting surface of the stem.

According to another aspect of the present invention, a heat radiating component for receiving a semiconductor element on its surface comprises a substrate base material which is made of one material selected from metals and ceramics, a polycrystalline diamond layer formed on at least one surface of the substrate base material, a first intermediate bonding layer of at least one material selected from elements belonging to the groups 4a, 5a, and 6a of the periodic table and oxides, carbides, nitrides and carbo-nitrides thereof formed on a prescribed surface region of the polycrystalline diamond layer, a second intermediate bonding layer of at least one material selected from Mo, Ni, Pd, Pt and Au formed on the first intermediate bonding layer, and a metal bonding layer of at least one metal selected from Au, Ag, Si, Ge, Sn, Pb and In formed on the surface of the second intermediate bonding layer and wherein the semiconductor element is mounted on the surface of the metal bonding layer. The materials for and the thicknesses of the metal bonding layer, the first intermediate bonding layer, the second intermediate bonding layer, the polycrystalline diamond layer, and the substrate base material are properly selected and set so that the thermal expansion coefficient of the overall heat radiating component has a value within a range of $4 \times 10^{-6}$ to $6 \times 10^{-5}/°$ C. at temperatures ranging from room temperature to 400° C.

In operation, the polycrystalline diamond layer is formed on at least one surface of the substrate base material and the first intermediate bonding layer of at least one material selected from elements belonging to the groups 4a, 5a and 6a of the periodic table and oxides, carbides, nitrides and carbo-nitrides thereof is formed on a prescribed surface region of the polycrystalline diamond layer while the second intermediate bonding layer of at least one material selected from Mo, Ni, Pd, Pt and Au is formed on the first intermediate bonding layer and the metal bonding layer of at least one metal selected from Au, Ag, Si, Ge, Sn, Pb and In is formed on the second intermediate bonding layer so that the semiconductor element is mounted on its surface. The materials for and the thicknesses of the metal bonding layer, the first intermediate bonding layer, the second intermediate layer, the polycrystalline diamond layer, and the substrate base material are properly selected and set so that the overall thermal expansion coefficient of the heat radiating substrate has a value within a range of $4 \times 10^{-6}$ to $6 \times 10^{-5}/°$ C. at temperatures ranging from room temperature to 400° C., whereby such a thermal expansion coefficient can easily coincide with that of the semiconductor element. Further, the bonding strength between the polycrystalline diamond layer and the metal bonding layer is improved by the first and second intermediate bonding layers.

According to still another aspect of the present invention, a heat radiating component comprises a substrate base material which is made of one material selected from metals and ceramics, a polycrystalline diamond layer formed on at least one surface of the substrate base material, and a metal bonding layer of at least one metal selected from Au, Ag, Si, Ge, Sn, Pb and In formed on a prescribed surface region of the polycrystalline diamond layer so that a semiconductor element is mounted on its surface. The materials for and the thicknesses of the metal bonding layer, the polycrystalline diamond layer, and the substrate base material are properly selected and set so that the overall thermal expansion coefficient of the heat radiating component has a value within a range of $4 \times 10^{-6}$ to $6 \times 10^{-5}/°$ C. at temperatures ranging from room temperature to 400° C.

In operation, the polycrystalline diamond layer is formed on at least one surface of the substrate base material and the metal bonding layer of at least one metal selected from Au, Ag, Si, Ge, Sn, Pb and In is mounted on a prescribed surface region of the polycrystalline diamond layer so that the semiconductor element is mounted on its surface, while the overall thermal expansion coefficient of the heat radiating component is within a range of $4 \times 10^{-6}$ to $6 \times 10^{-5}/°$ C. at temperatures ranging from room temperature to 400° C. to easily correspond to the thermal expansion coefficient of the semiconductor element since the materials for and the thicknesses of the metal bonding layer, the polycrystalline diamond layer, and the substrate base material are properly selected and set at prescribed values, respectively.

According to a further aspect of the present invention, a semiconductor laser provided with a heat radiating component comprises a stem which has a mounting surface for receiving or holding a semiconductor laser element thereon and a vapor-deposited polycrystalline diamond layer covering the mounting surface of the stem. The semiconductor laser element is bonded, for example, by brazing to the surface of the vapor-deposited diamond polycrystalline layer.

In operation, the overall mounting surface of the stem is covered with the polycrystalline diamond layer formed by vapor deposition. Thus, no brazing layer is required between the vapor-deposited polycrystalline diamond layer and the stem, whereby the heat radiation or heat transfer from the former to the latter is improved. The vapor-deposited polycrystalline diamond layer having a high thermal conductivity covers the entire mounting surface of the stem or a part having a wider area as compared with the contour of the semiconductor laser element, thereby increasing the thermal conduction surfaces. Thus, heat which is generated by the semiconductor laser element is diffused not only in the direction of depth of the stem but also along the plane of its mounting surface.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
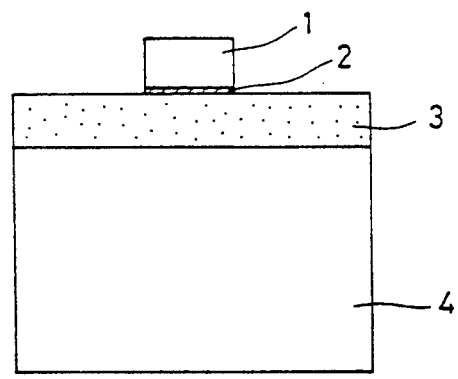
FIG. 2 illustrates a simplified side view, partly in section, of a semiconductor laser according to the present invention.

Referring to FIG. 2, a semiconductor laser according to the present invention comprises a stem 4, a vapor-deposited polycrystalline diamond layer 3 which is formed on the upper surface of the stem 4 by vapor deposition, and a semiconductor laser element 1 which is bonded onto the surface of the vapor-deposited polycrystalline diamond layer 3 by a brazing filler metal 2. Table 2 shows materials and shapes of the semiconductor laser 1, the vapor-deposited polycrystalline diamond layer 3, the brazing filler metal 2, and the stem 4 respectively.

TABLE 2

| Element 1 | Material: | Compound Semiconductor Composed of Ga, As, In, P, Al or the like |
|---|---|---|
| | Shape: | up to 0.5 mm square |
| Submount 5 | Material: | Polycrystalline Diamond Synthesized by Vapor Deposition (Thermal Conductivity: 500 to 2000 W/m · K, Specific Resistance: at least $10^9 \Omega \cdot cm$) |
| | Shape: | 10 to 500 μm thick, Covering Upper Surface of Stem |
| Brazing Filler Metals 2 | | Au—Sn Alloy, Pb—Sn Alloy or In |
| Stem 4 | Material: | Cu, Cu—W Alloy, Cu—Mo Alloy, Cu—W—Mo Alloy, W, Mo, SiC Sintered Body, $Si_3N_4$ Sintered Body or AlN Sintered Body |
| | Shape: | 5 to 15 mm square |

Figure 1:
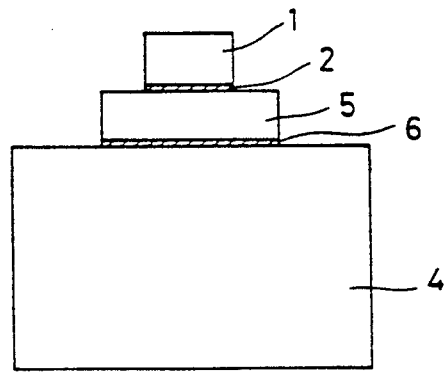
FIG. 1 illustrates a simplified side view, partly in section, of a conventional semiconductor laser.

The vapor-deposited polycrystalline diamond layer 3 is formed on the entire upper surface of the stem 4. Therefore, heat which is generated by the semiconductor laser element 1 is transmitted to the vapor-deposited polycrystalline diamond layer 3, to be diffused along the direction of depth and in the transverse direction in its interior. The heat is further diffused from the interface between the vapor-deposited polycrystalline diamond layer 3 and the stem 4 toward the interior of the stem 4. A region of the stem 4 contributing to heat radiation is widened as compared with the conventional semiconductor laser shown in FIG. 1. Thus, an effective heat radiation has been attained.

According to the present invention, the thermal conductivity of the vapor-deposited polycrystalline diamond layer 3 is preferably within the range of 500 to 2000 W/m·K, since no sufficient thermal conduction is attained if the thermal conductivity is less than 500 W/m K, while it is impossible to form a polycrystalline diamond layer whose thermal conductivity exceeds 2000 W/m·K with current technology.

Further, the specific resistance of the vapor-deposited polycrystalline diamond layer 3 is preferably at least $10^9$ Ω·cm. This is the condition which is necessary for ensuring insulability The thickness of the vapor-deposited polycrystalline diamond layer 3 is preferably within a range of 10 to 500 μm, since no effective radiation can be attained unless the thickness is at least 10 μm, while the heat radiating effect is not remarkably improved but the cost is increased if the thickness exceeds 500 μm.

Due to the employment of the vapor-deposited polycrystalline diamond layer 3 having a high thermal conductivity, the stem 4 may be made of W, Mo, an SiC sintered body, an $Si_3N_4$ sintered body, an AlN sintered body or the like, in addition to the conventional material of Cu, a Cu-W alloy, a Cu-Mo alloy or a Cu-W-Mo alloy.

Examples of the present invention will now be described to confirm the effect thereof.

EXAMPLE 1

Polycrystalline diamond was synthesized on an upper surface of 5 mm by 10 mm of a Cu stem by performing a microwave plasma CVD (chemical vapor deposition) for 8 hours under the following conditions:

| Raw Material Gas (Flow Rate): | $H_2$ 500 sccm |
| --- | --- |
| | $CH_4$ 20 sccm |
| Gas Pressure: | 70 Torr |
| Microwave Oscillation Output: | 600 W |

Thus, it was possible to cover the entire upper surface of the stem with a polycrystalline diamond layer of 50 μm in thickness. This polycrystalline diamond layer had a thermal conductivity of 1600 W/m·K and a specific resistance of $10^{10}$ Ω·cm.

Then, a Ga-Al-As optical semiconductor element (semiconductor laser element) of 0.2 mm square was bonded, e.g. by brazing to the upper surface of the polycrystalline diamond layer with a brazing filler metal of an Au-Sn alloy, thereby preparing a semiconductor laser (A).

In order to evaluate the heat radiating effect of the stem, the semiconductor laser (A) was caused to continuously oscillate with an output of 200 mW and the temperature rise of the semiconductor laser element was measured.

On the other hand, a comparative example was prepared by employing a single-crystalline synthetic diamond layer of 0.75 mm square having thermal conductivity of 2000 W/m·K as a submount which was provided on the surface of a stem. The single-crystalline synthetic diamond layer was brazed onto the surface of the stem, and a semiconductor laser element similar to the above was further bonded, e.g. by brazing to the surface of the single-crystalline synthetic diamond layer, to prepare a semiconductor laser (B). Then, the temperature rise of the semiconductor laser element was measured. In the comparative semiconductor laser (B), the submount was bonded to the stem by a brazing filler metal of an Au-Si alloy, and a semiconductor laser element was bonded onto the submount by another brazing filler metal of an Au-Sn alloy.

Table 3 shows the results of the tests for evaluating the heat radiating effects.

TABLE 3

| | Temperature of Semiconductor Element (°C.) |
| --- | --- |
| Invention Sample (A) | 35 |
| Comparative Sample (B) | 80 |

Referring to Table 3, it is understood that the temperature of the semiconductor laser element included in the semiconductor laser (A) of the invention, which was provided with the polycrystalline diamond layer formed on the upper surface of the stem, was substantially lower than that of the comparative semiconductor laser (B), which was provided with the submount of the single-crystalline synthetic diamond layer. Thus, the present semiconductor laser (A) has an excellent heat radiating effect.

EXAMPLE 2

In Example 2, an SiC stem of 15 mm by 10 mm was employed to synthesize polycrystalline diamond on its upper surface through thermal CVD. More specifically, a linear tungsten filament of 0.5 mm in diameter and 100 mm in length was employed as a thermoionic emission material, to synthesize the polycrystalline diamond by carrying out a thermal CVD for 20 hours under the following conditions:

| Raw Material Gas (Flow Rate): | $H_2$ 300 sccm |
| --- | --- |
| | $C_2H_2$ 15 sccm |
| Gas Pressure: | 80 Torr |
| Filament Temperature: | 2150° C. |
| Filament-to-Substrate Distance: | 6 mm |
| Substrate Temperature: | 920° C. |

Under these conditions it was possible to cover the overall upper surface of the stem with a polycrystalline diamond layer of 150 μm in thickness. This polycrystalline diamond layer had a thermal conductivity of 800 W/m·K and a specific resistance of $5 \times 10^9$ Ω·cm.

Then, an In-Ga-As-P semiconductor laser element of 0.3 mm square was bonded, e.g. by brazing onto the upper surface of the polycrystalline diamond layer by a brazing filler metal of an In alloy to form a semiconductor laser (C).

In order to evaluate the heat radiating effect of the stem, the semiconductor laser (C) was caused to continuously oscillate for 6000 hours with an initial output of 250 mW. The time change of the laser output was measured under this condition.

A comparative example was prepared by employing a single-crystal-line natural diamond layer of 1 mm square having a thermal conductivity of 1200 W/m·K as a submount which was mounted on the surface of the same stem as the above. More specifically, the single-crystalline natural diamond layer was brazed onto the surface of the stem and a semiconductor laser element was bonded, e.g. by brazing onto the surface of the single-crystalline natural diamond layer, to form a semiconductor laser (D). Then, the semiconductor laser (D) was evaluated. In the semiconductor laser (D) the submount was bonded onto the stem by a brazing filler metal of an Au-Si alloy, while the semiconductor laser element was bonded onto the submount by another brazing filler metal of an In alloy.

Table 4 shows the results of the test for evaluating the heat radiating effects.

TABLE 4

| | Laser Oscillation Output (mW) | | | | | |
| --- | --- | --- | --- | --- | --- | --- |
| | Immediately After Oscillation | 100 Hr | 500 Hr | 1800 Hr | 4000 Hr | 7000 Hr |
| Invention Sample (C) | 250 | 253 | 248 | 249 | 251 | 248 |
| Comparative Sample (D) | 250 | 248 | 251 | 240 | 225 | 203 |

Table 4 clearly shows that the present semiconductor laser (C) exhibited a very small change in its power output as a function of time, compared with the comparative semiconductor laser (D). This means that the present semiconductor laser (C) can efficiently radiate and dissipate heat generated by the semiconductor laser element.

EXAMPLE 3

In Example 3, various materials were employed for making the stems. Table 5 shows the materials for the stems and conditions for synthesizing polycrystalline diamond layers covering the upper surfaces of the stems. The polycrystalline diamond layers were synthesized by a thermal filament method under the conditions shown in Table 5. Table 6 shows properties of the polycrystalline diamond layers covering the upper surfaces of the stems.

TABLE 5

| No. | Material of Stem | Gas Composition/Flow Rate (sccm) | | Gas Pressure (Torr) | Filament Temperature (°C.) | Stem Temperature (°C.) | Synthesizing Time (h.) |
| --- | --- | --- | --- | --- | --- | --- | --- |
| E | Cu—Mo Alloy | $CH_4$: | 20 | 120 | 1,900 | 850 | 22 |
|   |   | $H_2$: | 500 |   |   |   |   |
| F | Cu | $C_2H_2$ | 50 | 85 | 2,100 | 950 | 55 |
|   |   | $H_2$ | 600 |   |   |   |   |
| G | AlN Sintered Body | $CH_4$: | 20 | 145 | 2,200 | 700 | 80 |
|   |   | $H_2$: | 500 |   |   |   |   |
| H | Cu—W—Mo Alloy | $CH_4$: | 50 | 90 | 2,050 | 1,020 | 24 |
|   |   | $H_2$: | 600 |   |   |   |   |
| I | $Al_2O_2$ Sintered Body | $CH_4$: | 20 | 200 | 1,950 | 880 | 46 |
|   |   | $H_2$: | 500 |   |   |   |   |
| J | SiC Sintered Body | $C_2H_2$: | 50 | 50 | 2,180 | 930 | 87 |
|   |   | $H_2$: | 600 |   |   |   |   |

TABLE 6

| No. | Thickness (μm) | Thermal Conductivity (W/m · K) | Specific Resistance (Ω · cm) |
| --- | --- | --- | --- |
| E | 15 | 800 | $6 \times 10^{11}$ |
| F | 3 | 1,500 | $6 \times 10^9$ |
| G | 80 | 300 | $3 \times 10^{12}$ |
| H | 250 | 1,800 | $2 \times 10^{10}$ |
| I | 380 | 1,200 | $5 \times 10^9$ |
| J | 55 | 750 | $5 \times 10^6$ |

Then, Ga-Al-As optical semiconductor elements (semiconductor laser elements) of 0.3 mm square were bonded, e.g. by brazing onto the upper surfaces of the polycrystalline diamond layers, thereby preparing semiconductor lasers (E) to (J).

In order to evaluate the heat radiating effects of the stems, the semiconductor lasers (E) to (J) were caused to continuously oscillate with outputs of 180 mW, and the temperature rises of the semiconductor elements were measured.

Table 7 shows the results of the tests for evaluating the heat radiating effects.

TABLE 7

| No. | Temperature of Semiconductor Element (°C.) | No. | Temperature of Semiconductor Element (°C.) |
| --- | --- | --- | --- |
| E | 30 | H | 25 |
| F | 70 | I | 28 |
| G | 80 | J | Incapable of Stable Laser Oscillation |

Referring to Table 7, it is understood that the temperatures of the semiconductor laser elements provided in the semiconductor lasers (F), (G) and (J) were too high to attain a sufficient heat radiating capacity of the stems. This may be due to the fact that the thickness of the polycrystalline diamond layer was too small in the semiconductor laser (F). In the semiconductor laser (G), it is conceivable that the thermal conductivity of the polycrystalline diamond layer was too low to sufficiently transmit the heat generated by the semiconductor laser element, to the stem. In the semiconductor laser (J), the semiconductor laser element was incapable of attaining a stable laser oscillation, possibly because the specific resistance of the polycrystalline diamond layer was too small. On the other hand, it is understood that the stems provided in the semiconductor lasers (E), (H) and (I) efficiently radiated heat since the semiconductor laser elements were at low temperatures.

Figure 3:
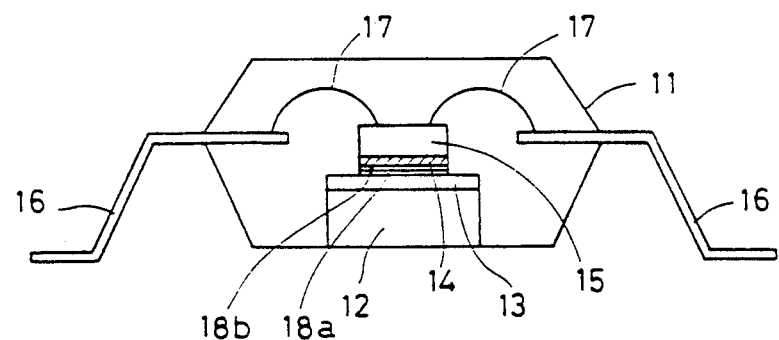
FIG. 3 illustrates a side view, partly in section, of an LSI package according to the present invention.

FIG. 3 shows an LSI package according to another aspect of the present invention. This LSI package comprises a package 11, a substrate base material 12 which is fixedly secured in the package 11, a polycrystalline diamond layer 13 which covers the upper surface of the substrate base material 12, an LSI chip 15 which is mounted on a prescribed surface region of the polycrystalline diamond layer 13 through a first intermediate bonding layer 18a, a second intermediate bonding layer 18b and a metal bonding layer 14, lead frames 16 which extend outwardly from the interior of the package 11, and bonding wires 17 for electrically connecting portions of the lead frames 16 provided in the interior of the package 11 with the electrode portions (not shown) of the LSI chip 15. While the substrate base material 12 can be made of a metal or ceramics, it is preferable to employ a sintered body which is mainly composed of a material selected from Si, Mo, W, a Cu-W alloy, a Cu-Mo alloy, SiC and AlN, considering that its surface for receiving the LSI chip 15 is covered with the polycrystalline diamond layer 13. The thickness of the substrate base material 12 is preferably 0.1 to 2 mm. If the thickness is smaller than 0.1 mm, strength of the substrate base material 12 may be problematically reduced, while the heat radiating property is lowered and the LSI package is increased in size if the thickness exceeds 2 mm.

As shown in FIG. 3, the upper surface of the substrate base material 12 is so covered with the polycrystalline diamond layer 13 that it is possible to improve the heat radiating property of a heat radiating substrate which is defined by the substrate base material 12, the polycrystalline diamond layer 13, the first intermediate bonding layer 18a, the second intermediate bonding layer 18b and the metal bonding layer 14, while suppressing heat distortion of the LSI chip 15.

The polycrystalline diamond layer 13 can be formed by any well-known low-pressure vapor phase method such as a method of decomposing and exciting a raw material gas through thermoionic emission or plasma discharge, a film forming method employing a burning flame, or the like. The raw material gas is generally prepared as a mixed gas which is mainly composed of an organic carbon compound of hydrocarbon such as methane, ethane or propane, alcohol such as methanol or ethanol, or ester, and hydrogen. In addition to such components, the raw material gas may contain an inert gas such as argon, oxygen, carbon oxide, water or the like in a range not inhibiting a reaction for synthesizing the diamond and the properties thereof.

The thermal conductivity of the polycrystalline diamond layer 13 must be within a range of 500 to 2000 W/m·K at temperatures ranging from room temperature to 400° C., in order to satisfy a heat radiating performance surpassing the heat radiating property of a conventional heat radiating substrate. As to the thermal conductivity, the upper limit of 2000 W/m·K merely indicates the maximum level which is attainable by the current technology, and a higher level of thermal conductivity is even preferable, if possible.

The thickness of the polycrystalline diamond layer 13, which depends on the type of the LSI chip 15 to be mounted thereon and specifications of the substrate base material 12, the first intermediate bonding layer 18a, the second intermediate bonding layer 18b and the metal bonding layer 14, is generally set in a range of 10 to 500 μm. If the thickness is less than 10 μm, it is impossible to attain any remarkable effects of improvement in the heat radiating property and suppression of heat distortion, while adhesion to the substrate base material 12 is reduced if the thickness exceeds 500 μm.

The first intermediate bonding layer 18a is made of at least one material selected from elements belonging to the groups 4a, 5a and 6a of the periodic table and oxides, carbides, nitrides and carbo-nitrides thereof. On the other hand, the second intermediate bonding layer 18b which is formed on the first intermediate bonding layer 18a is made of at least one material selected from Mo, Ni, Pd, Pt and Au. Both of the first and second intermediate bonding layers 18a and 18b are formed to have thicknesses of 0.01 to 5 μm to provide the required bonding strength.

The metal bonding layer 14 formed on the second intermediate bonding layer 18b contains at least one metal selected from Au, Ag, Si, Ge, Sn, Pb and In. The metal bonding layer 14 of a brazing filler metal such as Au preferably has a thickness of 1 to 50 μm, in consideration of its heat resistance and its thermal expansion coefficient. If the thickness is less than 1 μm, the LSI chip 15 cannot be sufficiently bonded onto the polycrystalline diamond layer 13 when the LSI chip 15 is large-sized, while no effect of improvement in the heat resistance meaning a reduced heat resistance is attained if the thickness exceeds 50 μm.

The materials for and the thicknesses of the substrate base material 12, the polycrystalline diamond layer 13, the first intermediate bonding layer 18a, the second intermediate bonding layer 18b, and the metal bonding layer 14 are so controlled that the overall thermal expansion coefficient of the heat radiating substrate defined by these three members is set at an arbitrary value within a range of $4\times10^{-6}$ to $6\times10^{-5}/°$ C. at temperatures ranging from the room temperature to 400° C., whereby these values correspond with that of the LSI chip 15 which is mounted thereon.

On the basis of the aforementioned essence of the present invention, the following further Examples were made in order to confirm the effect thereof.

EXAMPLE 4

Polycrystalline diamond was synthesized on a W-substrate of 20 mm square in size having a thickness of 1.5 mm by performing a microwave plasma CVD for 10 hours, under the following conditions:

| | |
|---|---|
| Raw Material Gas (Flow Rate): | $H_2$ 300 sccm |
| | $CH_4$ 8 sccm |
| Gas Pressure: | 100 Torr |
| Microwave Oscillation Output: | 400 W |

The upper surface of the W substrate recovered after the aforementioned synthesis was covered with a polycrystalline diamond layer of 0.2 mm in thickness. The surface of this layer was successively covered with a first intermediate bonding layer of Ti having a thickness of 0.06 μm and a second intermediate bonding layer of Pt having a thickness of 1.2 μm. The surface of the second intermediate bonding layer was further covered with a metal bonding layer of an Au-Sn alloy having a thickness of 30 μm, to form a heat radiating substrate (K1).

An Si LSI chip of 15 mm square was mounted on the heat radiating substrate (K1), which in turn was subjected to a performance evaluation.

A comparative example (L1) was prepared in a similar manner to the above, except that the heat radiating substrate was made of AlN of the same shape as the above. Another comparative sample (M1) was made as a conventional structure with a bonding material of silver paste. These comparative examples (L1) and (M1) were also subjected to a performance evaluation. The performance evaluation was made by carrying out thermal shock tests and measuring the heat resistance values, under the following conditions:

Thermal Shock Test

Each of the aforementioned heat radiating substrates carrying the LSI chips were alternately dipped in organic solvents which were set at temperatures of 125° C. and −55° C. repeatedly 100 times, and a damaged state of each LSI chip was observed.

Heat Resistance Measurement

Electric power of 4 W was applied to each LSI chip, and the temperature of the LSI chip was measured with an infrared thermometer when the same entered a stationary state.

Table 8 shows the results.

TABLE 8

| Sample | Result of Thermal Shock Test | Result of Measurement of Heat Resistance (LSI Temperature) |
|---|---|---|
| Invention Sample K1 | Not Damaged | 30° C. |
| Comparative Sample L1 | Cracked after 70 Times | 68° C. |
| Comparative Sample M1 | Cracked After 18 Times | 48° C. |

Referring to Table 8, it is understood that the sample (K1) of the invention exhibited a small difference in the thermal expansion coefficient with respect to the LSI chip substantially with no distortion dissimilarly to the comparative examples, while exhibiting an excellent heat radiating property.

EXAMPLE 5

A gas obtained by mixing $H_2$, $C_2H_6$ and Ar in ratios of 7:2:1 was supplied into a reaction tube, which was provided with a Cu-W-Mo alloy substrate 25 mm square having a thickness of 1.5 mm, at a flow rate of 400 sccm, and its pressure was adjusted to 120 Torr. Then, a high frequency radiation of 13.56 MHz was supplied by a high frequency generator for exciting the mixed gas and for generating plasma, thereby synthesizing polycrystalline diamond for 28 hours. The high frequency radiation had an output power of 750 W.

The upper surface of the substrate obtained by the aforementioned synthesis was covered with a polycrystalline diamond layer of 0.04 mm in thickness. The surface of this layer was successively covered with a first intermediate bonding layer of Ta having a thickness of 0.08 μm and a second intermediate bonding layer of Pd having a thickness of 2.0 μm. The surface of the second intermediate bonding layer was further covered with an Au-Si alloy so that its thickness was 38 μm, whereby a heat radiating substrate (N1) was formed.

A GaAs LSI chip of 18 mm square was mounted on this heat radiating substrate (N1), which was also subjected to a performance evaluation.

Comparative examples (O1 to T1) were prepared by combining bonding materials and heat radiating substrate materials as shown in Table 9, to be subjected to a performance evaluation. This performance evaluation was made by carrying out thermal shock tests and measuring the heat resistance values similarly to Example 4. Table 9 shows the results.

TABLE 9

| | Sample | | | | | | |
|---|---|---|---|---|---|---|---|
| | Substrate | Intermediate Bonding Layer | | Metal Bonding Layer | | Result of | Result of Measurement of Heat Resistance |
| No. | Material | Material | Thickness | Material | Thickness | Thermal Test | (LSI Temperature) |
| Invention Sample N1 | Cu—Mo Alloy Covered With Diamond | Ti Pt | 0.04 1.6 | Au—Si | 30 μm | Not Damaged | 25° C. |
| | | | | Comparative Sample | | | |
| O1 | Cu—Mo Alloy | Ta Au | 0.08 2.5 | Au—Si | 25 μm | Cracked After 60 Times | 50° C. |
| P1 | AlN Sintered | Nb Ni | 0.2 3.0 | Au—Si | 35 μm | Cracked After 20 | 50° C. |

TABLE 9-continued

| No. | Substrate Material | Sample Intermediate Bonding Layer Material | Thickness | Metal Bonding Layer Material | Thickness | Result of Thermal Test | Result of Measurement of Heat Resistance (LSI Temperature) |
| --- | --- | --- | --- | --- | --- | --- | --- |
| Q1 | Cu—Mo Alloy Body | V Mo | 0.35 2.0 | Silver Paste | 45 μm | Cracked After 80 Times | 75° C. |
| R1 | Cu—Mo Alloy | W Pt | 0.8 0.8 | Au—Sn | 40 μm | Cracked After 70 Times | 55° C. |
| S1 | SiC Sintered Body | Zr Pd | 1.5 4.5 | Au—Si | 15 μm | Cracked After 30 Times | 60° C. |
| T1 | AlN Sintered Body | Hf Au | 0.25 1.0 | Silver Paste | 25 μm | Cracked After 60 Times | 60° C. |

Referring to Table 9, it is understood that the present sample (N1 exhibited a small difference in the thermal expansion coefficient compared to the thermal expansion coefficient of the LSI chip substantially with no heat distortion dissimilarly to the comparative examples, while exhibiting an excellent heat radiating property.

Figure 4:
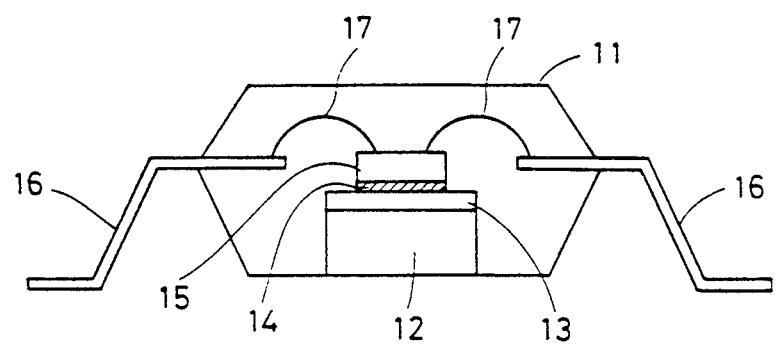
FIG. 4 illustrates a side view, partly in section, of another LSI package according to the present invention.

An LSI chip according to still another embodiment of the present invention will now be described. FIG. 4 is a sectional view showing the LSI package according to this aspect of the present invention comprising an LSI chip 15, which is mounted on a surface region of a polycrystalline diamond layer 13 through a metal bonding layer 14 alone, dissimilarly to the LSI package shown in FIG. 3. Also in this structure, an effect similar to that of the LSI package shown in FIG. 3 has been obtained. The following Examples were made in order to confirm the effect of the LSI package shown in FIG. 4.

EXAMPLE 6

Polycrystalline diamond was synthesized on an Si substrate of 20 mm square having a thickness of 1.5 mm by performing a microwave plasma CVD for 10 hours, under the following conditions:

| Raw Material Gas (Flow Rate): | $H_2$ 200 sccm $CH_4$ 5 sccm |
| --- | --- |
| Gas Pressure: | 80 Torr |
| Microwave Oscillation Output: | 600 W |

The upper surface of the Si substrate formed by the aforementioned synthesis, was covered with a polycrystalline diamond layer of 0.1 mm in thickness. The surface of this layer was further covered with a bonding material of an Au-Sn alloy in a thickness of 30 μm, to form a heat radiating substrate (K2).

An Si LSI chip of 15 mm square was mounted on the heat radiating substrate (K2), which in turn was subjected to a performance evaluation.

Comparative example (L2) was prepared in a similar manner to the above, except for that the heat radiating substrate was made of AlN having the same shape as the above embodiment of the invention. Another comparative example (M2) was prepared as a conventional structure with a bonding material of a silver paste. These comparative examples (L2) and (M2) were also subjected to a performance evaluation.

The performance evaluation was made by carrying out thermal shock tests and measuring the heat resistance values, under the following conditions:

Thermal Shock Test

Each of the aforementioned heat radiating substrates carrying the LSI chips was alternately dipped in organic solvents which were set at temperatures of 125° C. and −55° C. repeatedly (100 times), and a damaged state of each LSI chip was observed.

Heat Resistance Measurement

Electric power of 3 W was applied to each LSI chip, and the temperature of the LSI chip was measured with an infrared thermometer when the temperature entered a stationary state.

Table 10 shows the results.

TABLE 10

| Sample | Result of Thermal Shock Test | Result of Measurement of Heat Resistance (LSI Temperature) |
| --- | --- | --- |
| Invention Sample K2 | Not Damaged | 30° C. |
| Comparative Sample L2 | Cracked after 80 Times | 70° C. |
| Comparative Sample M2 | Cracked after 20 Times | 50° C. |

Referring to Table 10, it is understood that the present sample (K2 exhibited a small difference in the thermal expansion coefficient with respect to the LSI chip substantially with no heat distortion dissimilarly to the conventional examples, while exhibiting an excellent heat radiating property.

EXAMPLE 7

A gas obtained by mixing $H_2$, $C_2H_6$ and Ar in ratios of 8:1:1 was supplied into a reaction tube, which was provided with a Cu-Mo alloy substrate of 25 mm square having a thickness of 1 mm, at a flow rate of 500 sccm, and its pressure was adjusted to 135 Torr. Then, a high frequency radiation of 13.56 MHz was supplied by a high frequency generator for exciting the mixed gas and generating a plasma, thereby synthesizing polycrystalline diamond for 30 hours. The high frequency radiation had an output power of 800 W.

The upper surface of the substrate obtained after the aforementioned synthesis was covered with a polycrystalline diamond layer of 0.03 mm in thickness. The surface of this layer was further covered with a bonding material layer of an Au-Si alloy so that its thickness was 40 μm, thereby forming a heat radiating substrate (N2).

A GaAs LSI chip of 18 mm square was mounted on this heat radiating substrate (N2), which in turn was subjected to a performance evaluation.

Comparative examples (O2) to (T2) were prepared by combining bonding materials and heat radiating substrate materials as shown in Table 11, to be subjected to a performance evaluation. This performance evaluation was carried out by thermal shock tests and measuring heat resistance values similarly to Example 6. Table 11 shows the results.

The semiconductor laser according to the third embodiment of the present invention is provided with the heat radiating component, which comprises the stem having the mounting surface for receiving the semiconductor laser element thereon, and the vapor-deposited polycrystalline diamond layer covering the mounting surface of the stem. The semiconductor laser element is bonded, e.g. by brazing onto the surface of the vapor-deposited polycrystalline diamond layer, whereby the thermal conduction efficiency of the semiconductor laser element is so improved that it is possible to prevent the characteristic deterioration caused by heat which is

TABLE 11

| Sample No. | Substrate Material | Bonding Material Material | Bonding Material Thickness | Result of Thermal Shock Test | Result of Measurement of Heat Resistance (LSI Temperature) |
|---|---|---|---|---|---|
| Invention Sample N2 | Cu—Mo Alloy Covered with Diamond | Au—Si | 30 μm | Not Damaged | 25° C. |
| Comparative Sample O2 | Cu—Mo Alloy | Au—Si | 25 μm | Cracked After 60 Times | 50° C. |
| Comparative Sample P2 | AlN Sintered Body | Au—Si | 35 μm | Cracked After 20 Times | 50° C. |
| Comparative Sample Q2 | Cu—Mo Alloy | Silver Paste | 45 μm | Cracked After 80 Times | 75° C. |
| Comparative Sample R2 | Cu—Mo Alloy | Au—Sn | 40 μm | Cracked After 70 Times | 55° C. |
| Comparative Sample S2 | SiC Sintered Body | Au—Si | 15 μm | Cracked After 30 Times | 60° C. |
| Comparative Sample T2 | AlN Sintered Body | Silver Paste | 25 μm | Cracked After 60 Times | 60° C. |

Referring to Table 11 it is understood that the present sample (N2) exhibited a small difference in its thermal expansion coefficient compared to the thermal expansion coefficient of the LSI chip substantially with no heat distortion dissimilarly to the comparative examples, while exhibiting an excellent heat radiating property.

In the heat radiating component according to the first embodiment of the present invention, as hereinabove described, the polycrystalline diamond layer having a high thermal conductivity is vapor-deposited entirely over the upper surface of the stem, whereby the efficiency of thermal conduction from the semiconductor laser element is so improved that it is possible to avoid the characteristic deterioration caused by heat which is generated by the semiconductor laser element.

In the heat radiating component according to the second embodiment of the present invention as described above, it is possible to provide the heat radiating component which has a thermal expansion coefficient corresponding to that of the LSI chip mounted thereon, with an excellent heat radiating property. Further, the bonding strength between the metal bonding layer and the polycrystalline diamond layer is improved by the first and second intermediate bonding layer, whereby the heat radiating component has also been improved in strength.

In the heat radiating component according to the third aspect of the present invention, as described above, it is possible to easily form the heat radiating substrate to have a thermal expansion coefficient which corresponds with that of an LSI chip to be mounted thereon. Further, an excellent heat radiating property has also been achieved.

generated by the semiconductor laser element.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A heat radiating component for carrying a semiconductor element on its surface, said heat radiating component comprising: a substrate base material (12) made of a material selected from the group consisting of metals and ceramics; a polycrystalline diamond layer (13) formed on at least one surface of said substrate base material; a first intermediate bonding layer (18a) formed on a surface region of said polycrystalline diamond layer, wherein said first intermediate bonding layer is made of at least one material selected from the group consisting of elements from groups 4a, 5a and 6a of the periodic table and oxides, carbides, nitrides and carbonitrides of said elements; a second intermediate bonding layer (18b) formed on said first intermediate bonding layer, wherein said second intermediate bonding layer is made of at least one material selected from the group consisting of Mo, Ni, Pd, Pt and Au; and a metal bonding layer (14) formed on said second intermediate bonding layer for receiving said semiconductor element on the surface of said metal bonding layer, wherein said metal bonding layer is made of at least one metal selected from the group consisting of Au, Ag, Si, Ge, Sn, Pb and In, and wherein said materials for and thicknesses of said metal bonding layer, said first intermediate bonding layer, said second intermediate bonding layer, said polycrystalline diamond layer, and said substrate base material are so selected that an overall thermal expansion coefficient of said heat radiating component has a value within a range of $4 \times 10^{-6}$ to $6 \times 10^{-5}/°$C. at temperatures ranging from room temperature to 400° C.

2. The heat radiating component of claim 1, wherein said substrate base material is formed as a sintered body made substantially of at least one material selected from the group consisting of si, Mo, W, a Cu-W alloy, a Cu-Mo alloy, a Cu-Mo-W alloy and AlN.

3. The heat radiating component of claim 1, wherein said polycrystalline diamond layer has a thermal conductivity within a range of 500 to 2000 W/m·K at temperatures ranging from room temperature to 400° C.

4. A heat radiating component for carrying a semiconductor element on its surface, said heat radiating component comprising: a substrate base material (12) made of a material selected from the group consisting of metals and ceramics; a polycrystalline diamond layer (13) formed on at least one surface of said substrate base material; and a metal bonding layer (14) formed on a surface region of said polycrystalline diamond layer for holding said semiconductor element on its surface, wherein said metal bonding layer is made of at least one metal selected from the group consisting of Au, Ag, Si, Ge, Sn, Pb and In, and wherein said materials for and thicknesses of said metal bonding layer, said polycrystalline diamond layer, and said substrate base material are so selected that the overall thermal expansion coefficient of said heat radiating component has a value within a range of $4 \times 10^{-6}$ to $6 \times 10^{-5}/°$C. at temperature ranging from room temperature to 400° C.

5. The heat radiating component of claim 4, wherein said substrate base material is formed as a sintered body made substantially of at least one material selected from the group consisting of Si, Mo, W, a Cu-W alloy, a Cu-Mo alloy, SiC and AlN.

6. The heat radiating component of claim 4, wherein said polycrystalline diamond layer has a thermal conductivity within a range of 500 to 2000 W/m·K at temperatures ranging from room temperature to 400° C.

7. The heat radiating component of claim 5, wherein said polycrystalline diamond layer has a thermal conductivity within a range of 500 to 2000 W/m·K at temperatures ranging from room temperature to 400° C.

8. A semiconductor device provided with a heat radiating component, said heat radiating component comprising: a substrate base material made of material selected from the group consisting of metals and ceramics; a polycrystalline diamond layer formed on at least one surface of said substrate material; and a metal bonding layer formed on said polycrystalline diamond layer, wherein said metal bonding layer is made of at least one metal selected from the group consisting of Au, Ag, Pt, Ti, Mo, Ni, Si, Ge, Sn, Pb and In, wherein a semiconductor element of said semiconductor device is mounted on said metal bonding layer, and wherein said materials for and thicknesses of said metal bonding layer, said polycrystalline diamond layer, and said substrate base material are so selected that the overall thermal expansion coefficient of said heat radiating component has a value within a range of $4 \times 10^{-6}$ to $6 \times 10^{-5}/°$C. at temperatures ranging from room temperature to 400° C.

9. The semiconductor device of claim 8, wherein said substrate base material is formed as a sintered body made substantially of at least one material selected from the group consisting of Si, Mo, W, a Cu-W alloy, a Cu-Mo alloy, SiC and AlN.

10. The semiconductor device of claim 8, wherein said polycrystalline diamond layer has a thermal conductivity within a range of 500 to 2000 W/m·K at temperatures ranging from room temperature to 400° C.

11. The semiconductor device of claim 9, wherein said polycrystalline diamond layer has a thermal conductivity within a range of 500 to 2000 W/m·K at temperatures ranging from room temperature to 400° C.

12. A semiconductor laser comprising a semiconductor laser element, a heat radiating component, said heat radiating component comprising: a stem having a mounting surface for holding said semiconductor laser element thereon; ad a vapor-deposited polycrystalline diamond layer covering said mounting surface of said stem, and wherein said semiconductor laser element is bonded to said vapor-deposited polycrystalline diamond layer.

13. The semiconductor laser of claim 12, wherein said vapor-deposited polycrystalline diamond layer entirely covers said mounting surface of said stem.

14. The semiconductor laser of claim 12, wherein said vapor-deposited polycrystalline diamond laser has a thermal conductivity of at least 500 W/m·K and not more than 2000 1 W/m·K.

15. The semiconductor laser of claim 12, wherein said vapor-deposited polycrystalline diamond layer has a specific resistance of at least $10^9 \Omega$·cm.

16. The semiconductor laser of claim 12, wherein said vapor-deposited polycrystalline diamond layer has as thickness of at least 10 μm and not more than 500 μm.

17. The semiconductor laser of claim 12, wherein said stem is made of a material selected from the group consisting of Cu, a Cu-W alloy, a Cu-Mo alloy, a Cu-W-Mo alloy, W, Mo, an SiC sintered body, an $Si_3N_4$ sintered body and an AlN sintered body.

* * * * *

UNITED STATES PATENT AND TRADEMARK OFFICE
CERTIFICATE OF CORRECTION

PATENT NO. : 5,299,214

DATED : March 29, 1994

INVENTOR(S) : Tsutomu Nakamura, Takahisa Iguchi, Tetsuo Nakai

It is certified that error appears in the above-identified patent and that said Letters Patent is hereby corrected as shown below:

Column 8, Table 6, col. 4 of Table 6, "$6 \times 10^{11}$" should read: $--8 \times 10^{11}--$.

Claim 2, Column 17, line 9, "si" should be --Si--.

Claim 12, Column 18, line 29, "ad" should be --and--.

Claim 14, Column 18, line 41, "2000 1 W/m · K" should be: --2000 W/m · K--.

Signed and Sealed this

Thirtieth Day of August, 1994

*Attest:*

BRUCE LEHMAN

*Attesting Officer*   *Commissioner of Patents and Trademarks*